US008897076B2

(12) United States Patent
Lee et al.

(10) Patent No.: US 8,897,076 B2
(45) Date of Patent: Nov. 25, 2014

(54) NON-VOLATILE MEMORY SYSTEMS HAVING AT LEAST ONE PAIR OF MEMORY CELLS

(75) Inventors: Bong-Yong Lee, Suwon-si (KR); Jung-In Han, Hwaseong-Si (KR); Hae-Bum Lee, Suwon-si (KR); Sang-Eun Lee, Hwaseong-Si (KR); Jung-Ro Ahn, Suwon-si (KR); Kyung-Jun Shin, Hwaseong-Si (KR); Tae-Hyun Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 167 days.

(21) Appl. No.: 13/548,506

(22) Filed: Jul. 13, 2012

(65) Prior Publication Data

US 2013/0058169 A1 Mar. 7, 2013

(30) Foreign Application Priority Data

Sep. 6, 2011 (KR) ........................ 10-2011-0090238

(51) Int. Cl.
*G11C 16/28* (2006.01)
*G11C 16/06* (2006.01)
(52) U.S. Cl.
CPC ................ *G11C 16/06* (2013.01); *G11C 16/28* (2013.01)
USPC .................................. 365/185.21; 365/185.2
(58) Field of Classification Search
CPC .... G11C 16/28; G11C 16/26; G11C 11/5642; G11C 2211/5634
USPC .......................................... 365/185.2, 185.21
See application file for complete search history.

(56) References Cited

U.S. PATENT DOCUMENTS

| 5,852,571 | A | 12/1998 | Kinney |
| 6,297,985 | B1 | 10/2001 | Kang |
| 7,180,795 | B1 * | 2/2007 | Chan et al. ............... 365/189.09 |
| 2002/0048184 | A1 | 4/2002 | Kang et al. |
| 2003/0099125 | A1 | 5/2003 | Kang |
| 2010/0208511 | A1 * | 8/2010 | Rhie et al. ..................... 365/148 |

FOREIGN PATENT DOCUMENTS

| KR | 100339428 B1 | 5/2002 |
| KR | 100379513 B1 | 4/2003 |
| KR | 100463599 B1 | 12/2004 |

\* cited by examiner

*Primary Examiner* — Hoai V Ho
*Assistant Examiner* — Tri Hoang
(74) *Attorney, Agent, or Firm* — Harness, Dickey & Pierce

(57) ABSTRACT

In a non-volatile memory system, a plurality of main memory cells for storing data is arranged in a data cell array and a plurality of reference memory cells is arranged in a reference cell array. The reference cell array includes first reference word lines connected to first reference memory cells and extending, second reference word lines connected to second reference memory cells and extending alternately with the first reference word lines, reference bit lines to which the first and the second reference memory cells are alternately connected in a line and a combined cell having a pair of the first and second reference memory cells and generating a reference signal for processing the data. The first and the second reference memory cells have different cell characteristics. The stability of the reference signal is improved irrespective of the differentiation of the first and the second reference memory cells.

20 Claims, 5 Drawing Sheets

NON-VOLATILE MEMORY SYSTEMS HAVING AT LEAST ONE PAIR OF MEMORY CELLS

CROSS-REFERENCE TO RELATED APPLICATIONS

This application claims the benefit of Korean Patent Application No. 10-2011-0090238 filed on Sep. 6, 2011, in the Korean Intellectual Property Office, the disclosure of which is incorporated herein in its entirety by reference.

BACKGROUND

1. Field

Example embodiments relate to non-volatile memory systems and information processing systems including the same, and more particularly, to data-storage memory systems including flash memory devices and information processing systems including the data-storage memory systems.

2. Description of the Related Art

As portable electronic appliances such as a digital camera, a mobile phone such as a smart phone and a personal digital assistant (PDA) have become rapidly wide-spread, non-volatile memory systems have been in great demand. A non-volatile memory device can maintain data even after the power to the memory devices is turned off and has a much simpler horizontal structure of a unit cell than volatile memory devices such as a DRAM and SRAM. For those reasons, the degree of integration of the non-volatile memory device is much higher that the volatile memory device. For example, flash memory devices have become much more wide-spread due to the facilitation of data programming and erasing among the non-volatile memory devices. In addition, the portability of the recent mobile appliances strongly requires lower power consumption for the flash memory devices.

Flash memory devices may be classified into a NAND type and a NOR type according to the structure of the cell array. According to the NAND flash memory device, a plurality of memory cells is connected in series and configured into a single cell string and thus a single contact plug may be needed for the single string. In contrast, according to the NOR flash memory device, each of the memory cells is connected to a bit line and a word line irrespective of other memory cells. Thus, the NAND flash memory device has an advantage of a higher degree of integration while the NOR flash memory device has advantages of high operation speed and excellent random access ability.

A conventional flash memory system including the flash memory devices may detect a memory cell as a programmed cell or an erased cell by comparing the current of the memory cell with that of a reference cell. The currents of the memory cell and the reference cell may be amplified for the conveniences of the comparison by a sensor amplifier. Thus, the conventional flash memory device usually includes a data cell area in which a plurality of memory cells is arranged and electronic data may be stored in each of the memory cells and a reference cell area in which a plurality of reference cells is arranged and the reference current may be detected from each of the reference cells. Recently, the memory cells and the reference cells tend to be formed on the same substrate by the same process to promote manufacturing efficiency of the flash memory device.

To increase the degree of integration of the data cell area of the flash memory device, recent layouts for the flash memory device may reduce the number of the contact structures and thus sufficiently reduce the occupation spaces for the contact structures and the gap spaces between the contact structures and the gate patterns in the cell array region. For example, in a conventional NOR flash memory device, self-aligned source (SAS) rails are formed on the cell array region by a self-aligned etching process and an impurity implantation process in such a way that each of the SAS rails extends in parallel with a word line and a common source line (CSL) is commonly connected to the SAS rails along an active region of a substrate. Thus, the source signals are simultaneously transferred to each of the SAS rails through a single CSL.

According to the conventional NOR flash memory device, the CSL is arranged in parallel with a bit line and a source contact interconnecting the CSL and the SAS rail and a plurality of drain contacts interconnecting drain regions of each cell and the bit line are arranged adjacent with one another along the word line. Therefore, no contact structures are arranged on a first side area of the word line that is covered with the SAS rail and the source contact. The drain contacts are arranged on a second side area of the word line that is symmetrical to the first side area with respect to the word line. Thus, the layout of the conventional NOR flash memory device is usually designed in such way that the neighboring gate structures of the cell spaced apart by the first side area has a gap distance (referred to as first gap distance) smaller than the gap distance of the neighboring gate structures of the cell spaced apart by the second side area (referred to as second gap distance). The first gap distance is smaller than the second gap distance in the cell array region of the conventional NOR flash memory device. As a result, the first side area occupies a smaller space than the second side area in the NOR flash memory device and thus an overall space for the cell array region can be reduced as much as the reduction of the first side area, which increases the degree of integration of the NOR flash memory device.

Pairs of the word lines spaced apart by the second side area are arranged on the cell array region of the substrate at an interval of the SAS rail in the NOR flash memory device. The layout of the conventional NOR flash memory device includes a plurality of the word line pairs spaced apart by a pitch of the first side area that is covered with the SAS rail. The above layout is applied to the reference cell area as well as the data cell area of the NOR flash memory device. Accordingly, the cell transistors arranged along the active region of the substrate are spaced apart alternately by the first gap distance and the second gap distance along a direction perpendicular to the active region on both of the data cell area and the reference cell area.

However, the periodical change of the gap distances between the neighboring gate structures of the cell transistors usually requires periodical variations of process parameters in manufacturing the cell transistors, resulting in the periodical changes of the characteristics of the cell transistors. For example, the threshold voltages and the leakage currents of the cell transistors are periodically changed alternately with respect to the active region of the substrate. The cell transistors along one of the word line pairs at an upper side of the SAS rail (odd word line) has different cell characteristics from the cell transistors along the other of the word line pairs at a lower side of the SAS rail (even word line).

The characteristics change of the cell transistors between the odd and the even word lines becomes much greater due to the differences between etching conditions for the SAS rail and the contact structures and by misalignment of the contact structures. The junction areas of the neighboring cell transistors may be formed at different areas in the first side area due to the various processing errors of the self-aligned etching process and the ion implantation process for forming the SAS rail. Further, the incorrect alignment of the contact structures in the second side area may also deteriorate the cell characteristics of the neighboring cell transistors.

Since the data cell transistors and the reference cell transistors are usually formed on the same substrate by the same process, the above characteristics change of the cell transistors is also found in the reference cell area.

A general data reading operation is performed as follows in the conventional flash memory device. One of the word lines is selected by a row address signal from the data cell area and the reference cell area and one of the bit lines is selected by a column address signal from the data cell area and the reference cell area. Thus, the electrical voltage of a specific memory cell at which the selected word line and bit line crosses in the data cell area is detected as a data current and the electrical voltage of a specific memory cell at which the selected word line and bit line crosses in the reference cell area is detected as a reference current. The data current and the reference current are amplified in a sensor amplifier and the amplified data current and the reference current are compared with each other. The logical value of the data memory cell is determined by the comparison results of the data current and the reference current.

The threshold voltages of the reference cells are set to be an intermediate value between the threshold voltages of the data cells at a programming mode and an erasing mode and thus the reference current is required to be constant irrespective of the odd word lines and the even word lines.

However, the odd word lines and the even word lines have different cell properties due to the differentiation of the manufacturing process and thus the reference current derived from the reference cell connected to the odd word line (first reference current) is usually different from the reference current derived from the reference cell connected to the even word line (second reference current). The charge state of the reference cells may be varied according as which of the odd word line and the even word line is connected to the reference cell. Accordingly, the reference cells cannot generate a single reference current for comparing the data current.

For example, when a high voltage over about 6V is applied to the word line of the reference cell, the difference between the first and the second reference currents is significantly increased over an allowable error range. In addition, the difference between the first and the second reference currents tends to increase in proportion to an operation temperature in a temperature range of about −25° C. to about 100° C. under which most of the flash memory devices are operated.

Accordingly, there is still a need for an improved non-volatile memory device system in which the reference current is stable irrespective of the cell characteristics of the odd and the even word lines.

SUMMARY

Example embodiments of inventive concepts provide non-volatile memory systems in which the reference signal is stable irrespective of odd and even word lines connected to the reference cells.

Example embodiments of inventive concepts provide information process systems including the above non-volatile memory system.

According to an example embodiment, there is provided non-volatile memory systems including a data cell array including a plurality of main memory cells in which data are stored, a reference cell array for generating a reference signal and a reference cell controller. The reference cell array may include a plurality of first reference word lines connected to first reference memory cells and extending in a first direction, a plurality of second reference word lines connected to second reference memory cells and extending in the first direction alternately with the first reference word lines, a plurality of reference bit lines to each of which the first and the second reference memory cells are alternately connected in a line extending in a second direction perpendicular to the first direction and a combined cell having at least one pair of the first reference memory cell and the second reference memory cell and generating a reference signal for processing the data in the main memory cell. The first and the second reference memory cells may have different cell characteristics. The reference cell controller may select the first and the second reference memory cells in accordance with signals applied to the data cell array, configuring the combined cell.

In example embodiments, the first and the second reference memory cells in the combined cell may be connected to the same reference bit line, so that the combined cell may include a single pair of the first reference memory cell and the second reference memory cell.

In example embodiments, the first and the second reference memory cells of the combined cell may be connected to the first and the second word lines adjacent to each other.

In example embodiments, the combined cell may include a plurality of the first reference memory cells that may be connected to the different reference bit lines and a same number of the second reference memory cells, so that the combined cell may include a number of pairs of the first reference memory cell and the second reference memory cell.

In example embodiments, the number of pairs of the first reference memory cell and the second reference memory cell may be distributed arbitrarily in the reference cell array.

In example embodiments, the non-volatile memory systems may further include a plurality of reference source rails arranged in a first gap space between the first and the second reference word lines spaced apart by a first gap distance and a plurality of reference bit line contacts arranged in a second gap space between the first and the second reference word lines spaced apart by a second gap distance larger than the first gap distance. The reference bit line may make contact with the reference bit line.

In example embodiments, the non-volatile memory systems may further include at least a reference common source line making common contact with the reference source rails and extending in parallel with the reference bit line along the second direction and a plurality of reference source contacts arranged in the second gap space adjacently to the reference bit line contacts and making contact with both of the reference common source line and the reference source rails.

In example embodiments, the data cell array may include a plurality of first main word lines connected to first main memory cells and extending in the first direction, a plurality of second main word lines connected to second reference memory cells and extending in the first direction alternately with the first main word lines, a plurality of main bit lines to each of which the first and the second main memory cells are alternately connected in a line extending in a second direction perpendicular to the first direction, a plurality of main source rails interposed between the first and the second main word lines and a plurality of main bit line contacts making contact with the main bit lines. In such a case, the first main memory cell and the first reference memory cell may have the same cell characteristics and the second main memory cell and the second reference memory cell may have the same cell characteristics.

In example embodiments, the first main word line may be arranged in a body together with the first reference word line and the second main word line may also be arranged in a body together with the second reference word line, and further the main source rail may be arranged in a body together with the reference source rail.

In example embodiments, the non-volatile memory systems may further include at least a main common source line making common contact with the main source rails and extending in parallel with the main bit line along the second direction and a plurality of main source contacts arranged in the second gap space adjacently to the main bit line contact and making contact with both of the main common source line and the main source rails.

In example embodiments, the first and the second main memory cells and the first and the second reference memory cells may include a channel insulation layer on a semiconductor substrate, a floating gate layer on the channel insulation layer, an inter-gate dielectric layer on the floating gate layer and a control gate layer on the inter-gate dielectric layer, so that a NOR flash memory transistors may be arranged in the data cell array and the reference cell array.

In example embodiments, the cell characteristics may include a threshold voltage distribution and a leakage current distribution of the first and the second reference memory cells in the reference cell array.

In example embodiments, the non-volatile memory systems may further include a data cell controller connected to the data cell array and generating a data signal corresponding to the data stored in the main memory cell and a detector detecting a logical value of the data signal by amplifying and comparing the data signal and the reference signal.

In example embodiments, the data cell controller may include an address decoder for selecting one of the main memory cells in the data cell array and a bit line selector for detecting the data signal from the selected main memory cell and the detector may include a sensor amplifier for amplifying the data signal and the reference signal.

According to an example embodiment, there is provided information process systems including non-volatile memory systems and a central process unit. The non-volatile memory systems may include a data cell array for storing data and a reference cell array in which at least a pair of an odd reference memory cell and an even reference memory cell may be provided as a reference for sensing a logical value of the data. The odd reference memory cell may be connected to one of odd-numbered word lines and the even reference memory cell may be connected to one of even-numbered word lines in the reference cell array. The central process unit may be connected to the non-volatile memory systems and may process the data in the data cell array.

According to example embodiments of inventive concepts, at least one pair of the odd and even reference memory cells having different cell characteristics may be used as a reference cell from which the reference signal may be generated, improving the reliability and stability of the reference signal. Thus, the flash memory device including the pair of the odd and even reference memory cells as the reference cell in the reference cell array may be operated with high reliability and stability. As a result, the non-volatile memory systems including the flash memory device and various electronic apparatus having the non-volatile memory systems may also be operated with high reliability and stability.

According to example embodiments, there is provided non-volatile memory systems including a data cell array including a plurality of main memory cells in which data are stored, a reference cell array for generating a reference signal and a reference cell controller. The reference cell array may include a plurality of first reference memory cells extending in a first direction, a plurality of second reference memory cells extending in the first direction alternately with the first reference memory cells, and a combined cell having at least one pair of the first reference memory cell and the second reference memory cell and generating a reference signal for processing the data in the main memory cell. The first and the second reference memory cells may have different cell characteristics. The reference cell controller may select the first and the second reference memory cells in accordance with signals applied to the data cell array, thereby configuring the combined cell.

In example embodiments, the reference cell array includes a plurality of reference bit lines to each of which the first and the second reference memory cells are alternately connected in a line extending in a second direction perpendicular to the first direction In example embodiments, the first and the second reference memory cells in the combined cell may be connected to the same reference bit line, so that the combined cell may include a single pair of the first reference memory cell and the second reference memory cell.

In example embodiments, the combined cell may include a plurality of the first reference memory cells that may be connected to the different reference bit lines and a same number of the second reference memory cells, so that the combined cell may include a number of pairs of the first reference memory cell and the second reference memory cell.

In example embodiments, the non-volatile memory systems may further include a plurality of reference source rails arranged in a first gap space between the first and the second reference word lines spaced apart by a first gap distance and a plurality of reference bit line contacts arranged in a second gap space between the first and the second reference word lines spaced apart by a second gap distance larger than the first gap distance. The reference bit line may make contact with the reference bit line.

BRIEF DESCRIPTION OF THE DRAWINGS

Example embodiments will be more clearly understood from the following detailed description taken in conjunction with the accompanying drawings.

Figure 1:
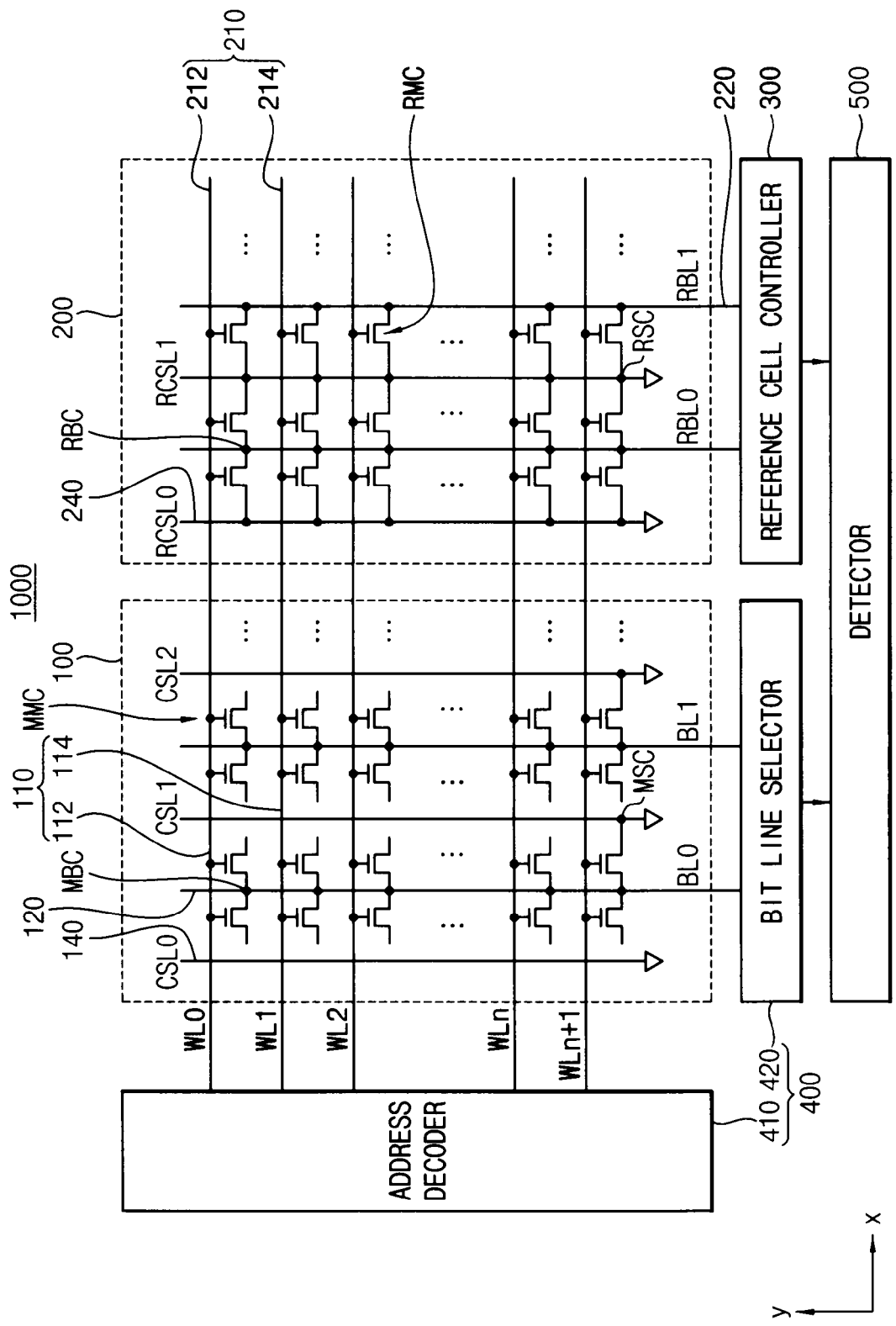
FIG. 1 is a circuit diagram illustrating a non-volatile memory system in accordance with example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
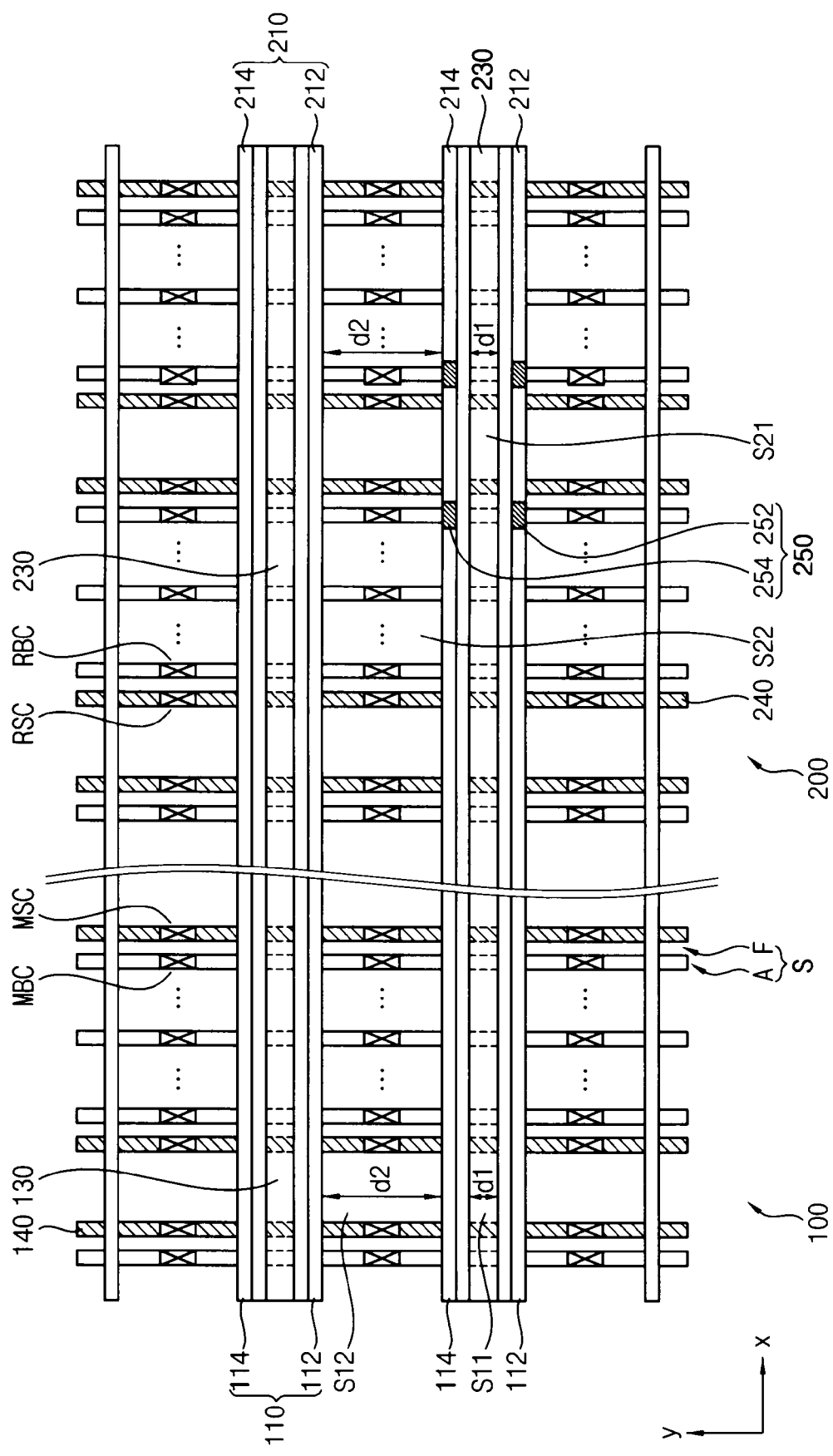
FIG. 2 is layout of an example memory cell array and a reference cell array of the non-volatile memory system shown in FIG. 1.

FIG. 1 is a circuit diagram illustrating a non-volatile memory system in accordance with example embodiments of inventive concepts. FIG. 2 is layout of a memory cell array and a reference cell array of the non-volatile memory system shown in FIG. 1.

Referring to FIGS. 1 and 2, a non-volatile memory system 1000 in accordance with example embodiments of inventive concepts may include a data cell array 100 having a plurality of main memory cells (MMC) to which data may be stored, a reference cell array 200 having a plurality of reference cells (RMC), a reference cell controller 300 for controlling the RMCs to generate a reference signal, a data cell controller 400 for controlling the MMCs to generate a data signal and a detector 500 for amplifying and comparing the reference signal and the data signal and to detect a logical value of the data signal.

For example, the data cell array 100 may include a cell area of a non-volatile memory device. In example embodiments, the data cell array 100 may include a cell area of a NOR flash memory device. For example, the data cell array 100 may include a plurality of main memory cells (MMC) arranged into a lattice on a first area of a substrate S such as a semiconductor wafer, a plurality of main word lines 110 extending in a first direction X and each of the word lines being connected to a plurality of MMCs in a line along the first direction X, a plurality of main bit lines 120 extending in a second direction Y and each of the bit lines being connected to a plurality of main bit line contacts MBC in a line along the second direction Y, a main source rail 130 extending in the first direction and commonly connected to source regions of the MMCs of the main word line 110 and a main common source line CSL 140 extending in the second direction and commonly connected to the main source rails 130. Each of the main bit line contacts MBC may be positioned at every drain area of the MMCs of the main word lines and a plurality of the main bit line contacts MBC arranged in a line along the second direction Y may be commonly connected to the same main bit line 120. Source signals may be simultaneously applied to the plurality of main source rails 130 through a single main CSL 140.

Each of the MMCs may include a stack gate structure on an active region A of the substrate S that may be defined by a field region F. The active region A and the field region F may be shaped into a line extending in the second direction Y. For example, the stack gate structure may include a tunnel insulation layer (not illustrated), a floating gate (not illustrated), an inter-gate dielectric layer (not illustrated) and a control gate (not illustrated) that may be sequentially stacked on the substrate S of the active region A. Source and drain areas may be arranged at opposite sides of the stack gate structure on the active region A of the substrate S. The control gate may be shaped into a continuous line extending in the first direction X as a gate line. Thus, the source and drain areas may be symmetrical to each other with respect to the gate line in the data cell array 100.

A conductive line may be positioned on each of the gate lines as the main word line 110 and thus the plurality of the MMCs aligning in the first direction X may be interconnected with one another through the main word line 110. A plurality of the main word lines 110 may be arranged in the second direction Y and the main word lines 110 may be spaced apart from each other by a gap distance corresponding to the source and drain areas.

The source areas of each gate structure may be connected to the main source rail 130 in series though a self-align process and the main source rail 130 may make contact with a main source contact MSC. The MSC may be connected to the MAIN CSL 140 and thus external source signals may be applied to the main source rails 130 through the MSC from the MAIN CSL 140. A main bit line contact MBC may be positioned on the drain area of the gate structure and the main bit line 120 may make contact with the MBC. The data stored in the MMCs may be detected through the main bit line 120 as the data signal.

While the main source rail 130 may make common contact with the neighboring gate lines, the main bit line contact MBC may be positioned at every drain area of the MMCs. The main source rail 130 may be formed by a self-aligned process using the gate line as an etching mask and thus may be accurately interposed between the neighboring gate lines in spite of the small gap space therebetween. The neighboring gate lines may sufficiently share the main source rail 130 no matter how closely the neighboring gate lines may be located due to the self-aligned process. In contrast, the MBC making contact with every drain area of the MMCs may be formed by an etching process such as a damascene process and thus may occupy a relatively large space at every drain area of the MMCs.

Accordingly, the process conditions of the self-aligned process for forming the main source rail 130 may be different from those of the damascene process for forming the MBC, and thus the MMCs of odd word lines may have different cell characteristics of the MMCs of even word lines. A pair of the gate lines having different cell characteristics may be arranged at both sides of the main source rail 130 and the gate line including the MMCs of the odd word lines and the gate line including the MMCs of the even word lines may be arranged along the second direction Y alternately with each other.

Hereinafter, the odd main word line may be referred to as first main word line 112 and the MMCs connected to the first main word line 112 may be referred to as first MMCs. In the same way, the even main word line may be referred to as second main word line 114 and the MMCs connected to the second main word line 114 may be referred to as second MMCs.

Therefore, a pair of the first and the second main word lines 112 and 114 may be spaced apart by a first gap distance d1 and thus a first main gap space S11 may be defined between the first main word line 112 and the second main word line 114 of the same pair. Further, pairs of the first and the second main word lines 112 and 114 spaced apart by the first main gap space S11 may be arranged in the data cell array 100 along the second direction Y by a second gap distance d2, and thus a second main gap space S12 may be defined between the first main word line 112 and the second main word line 114 of the neighboring pair. The first gap distance d1 may be shorter than the second gap distance d2 and thus the first main gap space S11 may have a smaller size than that of the second main gap space S12. The main source rail 130 may be positioned in the first main gap space S11 and the MBCs may be positioned in the second main gap space S12 corresponding to every cell.

Since the first and the second main word lines 112 and 114 may be alternately arranged on the data cell array 100 along the second direction Y, the first main gap space S11 and the second main gap space S12 may also be arranged on the data cell array 100 along the second direction Y.

The MBC located at the drain region of each cell in the second main gap space S12 may make contact with the main bit line 120, and thus the data stored in the main memory cell may be detected through the main bit line 120.

The main CSL 140 through which source signals may be applied to the main source rails 130 may be arranged along the active region A and the main source contact MSC may be positioned in the second main gap space S12 in a line with the MBCs. The MSC may make contact with the main CSL 140 and the main source rail 130 and thus the source signals may be transferred from the main CSL 140 to the main source rail 130 via the MSC. The MSC may be provided in the second main gap space S12 relatively more spacious than the first space S11, to increase space efficiency and the degree of integration of the non-volatile memory system 1000.

In example embodiments, the reference cell array 200 may include a plurality of reference memory cells (RMC) arranged into a lattice on a second area adjacent to the first area of the substrate S. A reference signal may be detected on a basis of the RMCs and the logical value of the data signal may be determined by comparison between the reference signal and the data signal.

Therefore, various memory devices may be used as the RMC as long as the reference signal may be generated from the memory devices. In example embodiments, the RMC may have the same structures and/or configurations as the MMC, to minimize the resistance loss of the reference current. For example, the RMC and the MMC may be simultaneously formed on the same substrate S by the same process using the same layout in such a configuration that the reference cell array 200 may be adjacent to the data cell array 100, to improve process efficiency and operation reliability of the non-volatile memory system 1000.

For example, the reference cell array 200 may include a plurality of reference word lines 210 extending in the first direction X in such a configuration that each of the reference word lines may be connected to a plurality of RMCs in a line along the first direction X. The reference word lines 210 may include first reference word lines 212 that may be connected to a plurality of first RMCs and second reference word lines 214 that may be connected to a plurality of second RMCs of which the cell characteristics may be different from the first RMCs. The first and the second reference word lines may be alternately arranged on the reference cell area 200 of the substrate S. Thus, the threshold voltage distribution and the leakage current distribution of the first RMCs may be different from those of the second RMCs. Other various cell characteristics such as operational features depending on the temperature may also be different as well as the threshold voltage distribution and the leakage current distribution between the first and the second RMCs, as would be known to one of ordinary skill in the art.

The first RMCs in the reference cell area 200 may have the same structures and configurations as the first MMCs in the data cell area 100 and the second RMCs in the reference cell area 200 may also have the same structures and configurations as the second MMCs in the data cell area 100. As a result, the first and the second reference word lines 212 and 214 in the reference cell area 200 may have the same structures and configurations as the first and the second main word lines 112 and 114 in the data cell area 100.

Therefore, a pair of the first and the second reference word lines 212 and 214 may be spaced apart by the first gap distance d1 and thus a first reference gap space S21 may be defined between the first reference word line 212 and the second reference word line 214 of the same pair. Further, pairs of the first and the second reference word lines 212 and 214 spaced apart by the first reference gap space S21 may be arranged in the reference cell array 200 along the second direction Y by the second gap distance d2, and thus a second reference gap space S22 may be defined between the first reference word line 212 and the second reference word line 214 of the neighboring pair. Since the first gap distance d1 may be shorter than the second gap distance d2, the first reference gap space S21 may have a smaller size than that of the second reference gap space S22 similar to the first and the second main gap spaces S11 and S12.

Since the first and the second reference word lines 212 and 214 may be alternately arranged along the second direction Y in the reference cell area 200, the first and the second reference gap spaces S21 and S22 may also be alternately arranged along the second direction Y in the reference cell area 200. A reference source rail 230 may be positioned in the first reference gap space S21 and a plurality of reference bit line contacts (RBC) may be positioned in the second reference gap space S22 corresponding to every reference memory cell. The source areas of the first and the second RMCs may make common contact with the reference source rail 230 in the first reference gap space S21 and each drain area of the RMCs may make contact with the respective RBC in the second reference gap space S22.

In example embodiments, the reference source rail 230 may have the same structures and configurations as the main source rail 130 and the RBC may have the same structures and configurations as the MBC.

A plurality of reference bit lines 220 may extend in the second direction Y and may be alternately connected to the first and the second RMCs through the RBCs.

The reference bit line 220 may make contact with the RBC that may be positioned at the drain area of each RMC in the second reference gap space S22. Thus, the electric charge state in the RMC may be detected as a base signal through the reference bit line 220. The base signal may be configured into the reference signal in the combined cell 250 described hereinafter. In example embodiments, the reference bit line 220 may have the same structures and configurations as the main bit line 120 and may be formed by the same process as the main bit line 120.

The reference source rail 230 may include a conductive line extending in the first direction X and may make common contact with the source areas of the first and the second RMCs. Thus, source sides of the first and the second reference word lines 212 and 214 may be commonly connected to the same reference source rail 230. In example embodiments, the reference source rail 230 may be formed by the same self-aligned process as the main source rail 130 and may be positioned in the first reference gap space S21.

A reference CSL 240 may extend in parallel with the active region A along the second direction Y and may be commonly connected to the reference source rails 230. A reference source contact RSC may be positioned in the second reference gap space S22 in a line with the RBCs along the first direction X. A plurality of the RSCs may be arranged on the reference cell area 200 of the substrate S along the second direction Y. The RSC may make contact with both of the reference CSL 240 and the reference source rail 230 and thus the source signals may be transferred from the reference CSL 240 to the reference source rail 230 via the RSC. The RSC may be provided in the second reference gap space S22 relatively more spacious than the first reference gap space S21, to increase space efficiency and the degree of integration of the non-volatile memory system 1000. In example embodiments, the reference CSL 240 and the main CSL 140 may be simultaneously formed by the same process and thus the reference CSL 240 may have the same structures and configurations as the main CSL 140.

A combined cell 250 may be arranged in the reference cell array 200 and the reference signal compared with the data signal may be generated from the combined cell 250. The combined cell 250 may include at least one of the first RMCs and at least one of the second RMCs, so that the cell characteristics of the combined cell 250 may be determined how the first and the second RMCs may be combined with each other in the combined cell 250.

For example, the combined cell 250 may include a first cell 252 selected from the first RMCs and a second cell 252 selected from the second RMCs having the cell characteristics different from the first RMCs. When the combined cell 250 includes the same number of the first and the second RMCs, the cell characteristics of the combined cell 250 may be a mean value of the cell characteristics of the first and the second RMCs. Accordingly, the deviation of the cell characteristics may be sufficiently improved in the combined cell 250 as compared with the cell characteristics of the conventional reference cell from which the reference signal may be generated. The conventional reference cell may include just merely the first RMCs or merely the second RMCs. The combined cell 250 may be less influenced by the differentiations of the process conditions for manufacturing the first and the second RMCs.

For example, the combined cell 250 may include a pair of the first and the second RMCs making contact with the same reference bit line and thus the first and the second cells 252 and 254 may be arranged in a line extending in the second direction Y. Thus, the reference signal may be detected from the combined cell 250 by the detector 500 through a single reference bit line 220.

In such a case, the first and the second cells 252 and 254 may include the first and the second RMCs in the same pair of the first and the second reference word lines 212 and 214 or a different pair thereof. The first and the second cell 252 and 254 may include RMCs of the first and the second reference word lines 212 and 214 that may be spaced apart by the first reference gap space S21 or may include RMCs of the first and the second reference word lines 212 and 214 that may be spaced apart by the second reference gap space S22. Therefore, the first and the second cells 252 and 254 may be symmetrical to each other with respect to the reference source rail 230 or with respect to at least a pair of the reference source rails 230 and the second reference gap space S22 between the pair of the reference source rails 230.

In contrast, the combined cell 250 may include a plurality of the first and the second RMCs making contact with the respective reference bit lines 220 different from each other and thus the first and the second cells 252 and 254 may be randomly distributed in the reference cell array 200. In such a case, the first and the second cells 252 and 254 may include the same number of the first and the second RMCs and thus the cell characteristics of the combined cell 250 may be prevented from being inclined to one of the cell characteristics of the first and the second RMCs. The combined cell 250 may include a plurality of pairs of the first and the second RMCs. In such a case, the first and the second cells 252 and 254 may be connected to a number of reference bit lines.

In example embodiments, the first and the second RMCs may be selected for the combined cell 250 by the source signals that may be applied to the reference source rails 230 and thus at least one of the first RMCs of which the source areas may be activated by the source signal may be selected as the first cell 252 and the second RMCs of which the source areas may be activated by the source signal may be selected as the second cell 254. When the selected first and second RMCs make contact with respective reference bit lines different from one another, at least an additional detection line (not illustrated) may be provided between the combined cell 250 and the respective reference bit lines.

The reference cell controller 300 for generating the reference signal from the combined cell 250 including the RMCs may be connected to the reference cell array 200 in series and the data cell controller 400 for generating the data signal from the MMCs may be connected to the data cell array 100 in series.

The reference cell controller 300 may include at least a line selector (not illustrated) for selecting the reference word line and the reference bit line and the reference cells specified by the selection of the reference word line and the reference bit line may be configured into the combined cell 250. The charge state of the combined cell 250 may be detected as the reference signal. For example, the reference cell controller 300 may include a plurality of PMOS and NMOS transistors and may select the reference cells in relation to a selected main memory cell that is to be processed for reading and programming.

Figure 3:
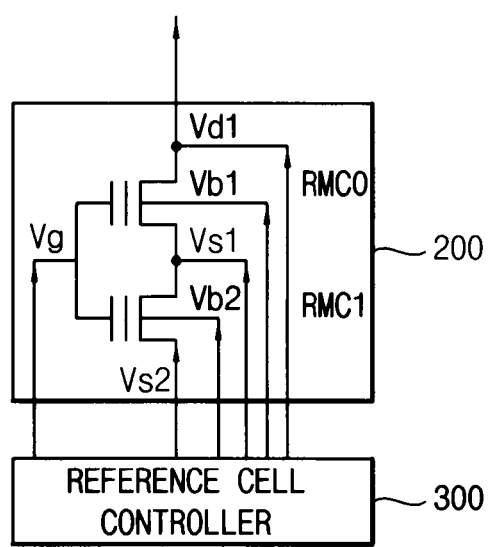
FIG. 3 is a circuit diagram illustrating a reference cell array in accordance with example embodiments of inventive concepts.

FIG. 3 is a circuit diagram illustrating a reference cell array in accordance with example embodiments of inventive concepts.

Referring to FIG. 3, a drain voltage Vd1 may be applied to a drain electrode of the first reference memory cell RMC0 and a source voltage Vs2 may be applied to a source electrode of the second reference memory cell RMC1, thus a pair of the first and the second reference cell memories RMC0 and RMC1 may be selected as the combined cell 250 from which the reference signal may be generated. First and second bulk voltages Vb1 and Vb2 may be applied to the gate electrodes of the first and the second reference memory cells RMC0 and RMC1. In such a case, no voltage may be applied to the source electrode of the first reference memory cell RMC0 and the second reference memory cell RMC1 may be connected in series to the source electrode of the first reference memory cell RMC0. Further, the first and the second reference memory cells RMC0 and RMC1 may share a common gate electrode and a gate voltage may be applied to the common gate electrode in accordance with operation modes with respect to the data signal. The drain voltage, the source voltage and the bulk voltage may be controlled by the reference cell controller 300 in such a configuration that a pair of the first and the second reference memory cells RMC0 and RMC1 may be provided as the combined cell 250.

Thus, the combination of the pair of the reference memory cells selected from the first RMCs and the second RMCs in the reference cell array 200 may sufficiently stabilize the reference signal in spite of the different cell characteristics of the first and the second RMCs.

The data cell controller 400 may include an address decoder 410 for selecting a particular main memory cell from the data cell array 100 and a bit line selector 420 for detecting the data signal from the selected main memory cell. The address decoder 410 may include a row decoder for selecting the main word line 110 and a column decoder for selecting the main bit line 120 and may select the main word line 110 and the main bit line 120 by decoding external address signals. Therefore, the particular main memory cell that is to be detected as the data signal may be selected by the address decoder 410. The bit line selector 420 may select the main bit line 120 that may be connected to the particular main memory cell selected by the address signals, and thus the charge state of the particular main memory cell may be detected by the main bit line selected by the bit line selector 420.

The data signal detected from the selected main memory cell and the reference signal detected from the combined cell 250 may be transferred into the detector 500. The data signal and the reference signal may be amplified and compared with each other in the detector 500. The logical value of the data signal may be determined by the comparison results between the data signal and the reference signal, performing the reading process from or the programming process into the selected main memory cell.

For example, the detector 500 may include a sensor amplifier (not illustrated) and an output driver (not illustrated). The sensor amplifier may amplify the data signal transferred from the data cell array 100 and the reference signal transferred from the reference cell array 200 and may sense or detect the logical value of the data signal by comparison between the amplified data and reference signals. The output driver may output the logical value of the data signal sensed or detected by the sensor amplifier.

According to the above example embodiments of the non-volatile memory system, a pair of the first and the second reference memory cells having different cell characteristics may be configured into the combined cell from which the reference signal is generated, improving reliability and stability of the reference signals in spite of the differentiations of the cell characteristics of the memory cells and decreasing operational failures of non-volatile memory devices caused by the instability of the reference signals.

Figure 4A:
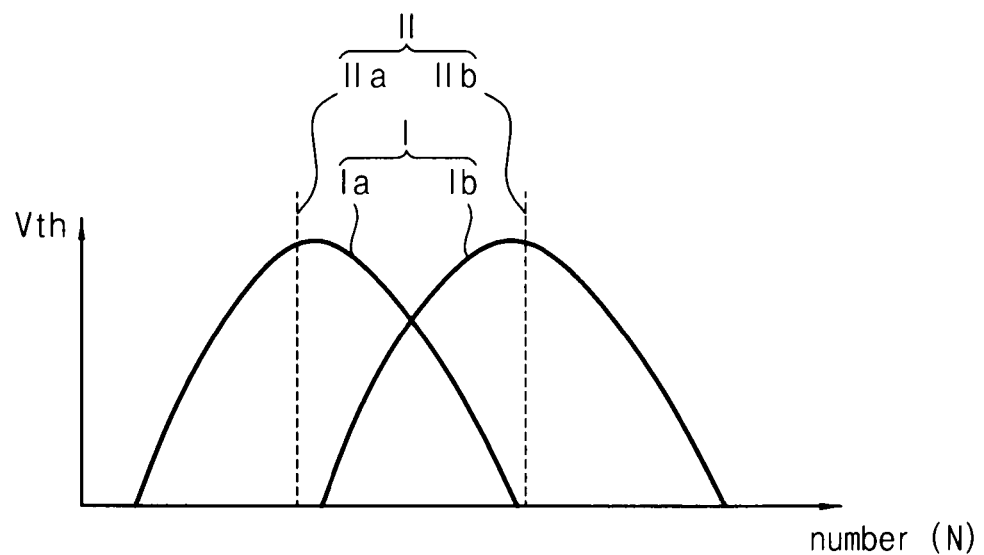
FIG. 4A is a view illustrating the operation of sensing the logical value of the data signal using an unstable reference signal in the conventional non-volatile memory system.
Figure 4B:
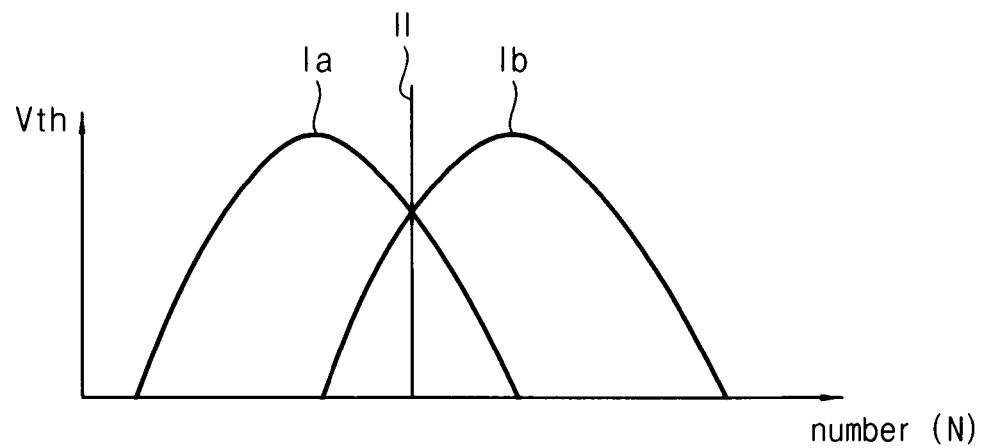
FIG. 4B is a view illustrating the operation of sensing the logical value of the data signal using a stable reference signal in the non-volatile memory system according to example embodiments of inventive concepts.

FIG. 4A is a view illustrating the operation of sensing the logical value of the data signal using an unstable reference signal in the conventional non-volatile memory system and FIG. 4B is a view illustrating the operation of sensing the logical value of the data signal using a stable reference signal in the non-volatile memory system according example embodiments of inventive concepts.

In FIGS. 4A and 4B, the horizontal axis denotes a number of the memory cells and the vertical axis denotes the threshold voltage at each of the memory cells. Thus, Graph I indicates the distribution of the threshold voltages of the main memory cells MMC in the data cell array and Graph II indicates the distribution of the threshold voltages of the reference memory cells in the reference cell array.

As shown in FIG. 4A, the reference signal II of the conventional non-volatile memory system may be varied in accordance with which of the first and the second RMCs may be selected as the reference cell, because the first and the second RMCs in the reference cell array may have different cell characteristics. Thus, the reference signal II of the conventional non-volatile memory system may be detected as a first reference signal IIa and a second reference signal IIb according to the RMCs selected as the reference cell. As a result, the reference signal II may or may not function as a reference for determining the logical value of the data signal according as the data signal may be generated from which of the first and the second MMCs in the data cell array.

For example, the first reference signal IIa that may be detected from one of the first RMCs may function as the reference for determining the logical value of a first data signal Ia that may be detected from one of the first MMCs, while not functioning as the reference for determining the logical value of a second data signal Ib that may be detected from one of the second MMCs.

However, as shown in FIG. 4B, the reference signal II of the non-volatile memory system 1000 may be stable or uniform regardless of the differentiation of the cell characteristics between the first and the second RMCs, because the combined cell 250 includes at least a pair of the first and the second RMCs in the reference cell array 200. Thus, the reference signal II of the non-volatile memory system 1000 may sufficiently function as the reference for determining the logical value of the data signal no matter which of the first and the second MMCs may be selected for the data signal in the data cell array.

Therefore, the reading and programming of data may be performed with high reliability in the non-volatile memory system 100.

While the present example embodiments discloses a NOR flash memory system in which the MBCs may be arranged at every MMCs and thus the MMC may be accessed individually, any other non-volatile memory systems known to one of ordinary skill in the art may also utilize the combined cell as a reference cell. For example, example embodiments of inventive concepts with the combined cell as the reference cell may be applied to a NAND flash memory system in which a plurality of memory blocks having a number of the MMCs may be connected in a string in the data cell array.

Figure 5:
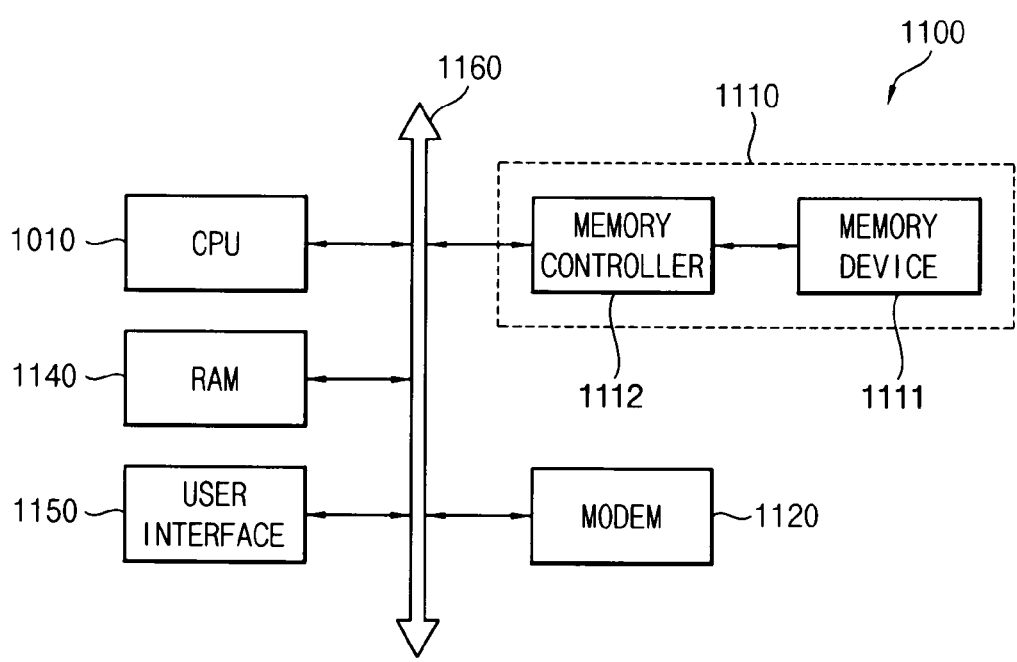
FIG. 5 is an example block diagram illustrating an information process system including the non-volatile memory system shown in FIG. 1.

FIG. 5 is a block diagram illustrating an information process system including the non-volatile memory system shown in FIG. 1.

Referring to FIG. 5, the information process system 1100 may include the non-volatile memory system 1110. For example, the non-volatile memory system 1110 may include a flash memory system in which at least one pair of an odd RMC and an even RMC may be used as the combined cell from which the reference signal for determining the logical value of the data signal.

Thus, the non-volatile memory system 1110 may include a flash memory device 111 of which the reference cell may include at least one pair of the first RMC and the second RMC and a controller 1112 for amplifying the data signal and the reference signal and sensing the logical value of the data signal by comparison of the data signal and the reference signal.

The information process system 1100 may further include a MODEM 1120, a CPU 1130, a RAM 1140 and a user interface 1150 that may be electrically connected to the memory system 1110 through a system bus 1160. External data may be transferred to the memory system 1110 and the processed data handled by the CPU 1130 may be temporarily stored in the memory system 1110.

In such a case, data communication between the CPU 1130 and the memory system 1110 may include a great number of data detection by comparison of the data signal and the reference signal. Since the reference signal may be generated from the reference cell array with high reliability and stability irrespective of the cell characteristics of the individual reference memory cells in the reference cell array.

For example, since the flash memory device has been recently widely used as various storage devices, the improved reliability and stability of the reference signal may sufficiently increase operational reliability in reading and programming data in the flash memory device, sufficiently increasing the reliability and stability of the information process system 1100. For that reason, the system resources of the information process system 1100 may be focused into the information process rather than the handling of the system error caused by the unstable reference signal, improving the processing speed of the information process system 1100.

Although not illustrated in figures, the information process system 1100 may further include an application chipset, a camera image processor (CIS), a mobile DRAM and various input/output units.

According to example embodiments of inventive concepts, at least one pair of the odd and even reference memory cells having different cell characteristics may be used as a reference cell from which the reference signal may be generated, improving the reliability and stability of the reference signal. Thus, the flash memory device including the pair of the odd and even reference memory cells as the reference cell in the reference cell array may be operated with high reliability and stability. As a result, the non-volatile memory system including the flash memory device and various electronic apparatus having the non-volatile memory system may also be operated with high reliability and stability.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory system comprising:
   a data cell array including a plurality of main memory cells in which data are stored; and
   a reference cell array including, a plurality of first reference word lines connected to first reference memory cells and extending in a first direction, a plurality of second reference word lines connected to second reference memory cells and extending in the first direction alternately with the first reference word lines, a plurality of reference bit lines to each of which the first and the second reference memory cells are alternately connected in a line extending in a second direction perpendicular to the first direction, and a combined cell having at least one pair of the first reference memory cell and the second reference memory cell that share a common gate, the common gate being enabled in both the first reference memory cell and the second reference memory cell in the at least one pair such that a current flows in both the first reference memory cell and the second reference memory cell in the at least one pair at a same time to generate a reference signal for processing the data in the main memory cell, the first and the second reference memory cells having different cell characteristics.

2. The non-volatile memory system of claim 1, wherein the first and the second reference memory cells in the combined cell are connected to the same reference bat line, so that the combined cell includes a single pair of the first reference memory cell and the second reference memory cell.

3. The non-volatile memory system of claim 2, wherein the first and the second reference memory cells of the combined cell are connected to the first and the second word lines adjacent to each other, respectively.

4. The non-volatile memory system of claim 1, wherein the combined cell includes a plurality of the first reference memory cells that are connected to the different reference bit lines and a same number of the second reference memory cells, so that the combined cell includes a number of pairs of the first reference memory cell and the second reference memory cell.

5. The non-volatile memory system of claim 4, wherein the number of pairs of the first reference memory cell and the second reference memory cell are distributed arbitrarily in the reference cell array.

6. The non-volatile memory system of claim 1, further comprising a plurality of reference source rails arranged in a first gap space between the first and the second reference word lines spaced apart by a first gap distance and a plurality of reference bit line contacts arranged in a second gap space between the first and the second reference word lines spaced apart by a second gap distance larger than the first gap distance, the reference source rails making contact with the reference bit line contacts.

7. The non-volatile memory system of claim 6, further comprising at least a reference common source line making common contact with the reference source rails and extending in parallel with the reference bit line along the second direction and a plurality of reference source contacts arranged in the second gap space adjacent to the reference bit line contacts and making contact with both of the reference common source line and the reference source rails.

8. The non-volatile memory system of claim 6, wherein the data cell array includes, a plurality of first main word lines connected to first main memory cells and extending in the first direction, a plurality of second main word lines connected to second reference memory cells and extending in the first direction alternately with the first main word lines, a plurality of main bit lines to each of which the first and the second main memory cells are alternately connected in a line extending in a second direction perpendicular to the first direction, a plurality of main source rails interposed between the first and the second main word lines, and a plurality of main bit line contacts making contact with the main bit lines, the first main memory cell and the first reference memory cell having the same cell characteristics and the second main memory cell and the second reference memory cell having the same cell characteristics.

9. The non-volatile memory system of claim 8, wherein the first main word line is arranged in a body together with the first reference word line and the second main word line is also arranged in a body together with the second reference word line, and further the main source rail is arranged in a body together with the reference source rail.

10. The non-volatile memory system of claim 8, further comprising at least a main common source line making common contact with the main source rails and extending in parallel with the main bit line along the second direction and a plurality of main source contacts arranged in the second gap space adjacently to the main bit line contact and making contact with both of the main common source line and the main source rails.

11. The non-volatile memory system of claim 8, wherein the first and the second main memory cells and the first and the second reference memory cells include a channel insulation layer on a semiconductor substrate, a floating gate layer on the channel insulation layer, an inter-gate dielectric layer on the floating gate layer and a control gate layer on the inter-gate dielectric layer, so that a NOR flash memory transistors are arranged in the data cell array and the reference cell array.

12. The non-volatile memory system of claim 1, wherein the cell characteristics include a threshold voltage distribution and a leakage current distribution of the first and the second reference memory cells in the reference cell array.

13. The non-volatile memory system of claim 1, further comprising a data cell controller connected to the data cell array and generating a data signal corresponding to the data stored in the main memory cell and a detector detecting a logical value of the data signal by amplifying and comparing the data signal and the reference signal.

14. The non-volatile memory system of claim 13, wherein the data cell controller includes an address decoder for selecting one of the main memory cells in the data cell array and a bit line selector for detecting the data signal from the selected main memory cell and the detector includes a sensor amplifier for amplifying the data signal and the reference signal.

15. The non-volatile memory system of claim 1, further comprising a reference cell controller configured to select the first and the second reference memory cells in accordance with signals applied to the data cell array, thereby configuring the combined cell.

16. A non-volatile memory system comprising:

a data cell array including a plurality of main memory cells in which data are stored;

a reference cell array including, a plurality of first reference memory cells extending in a first direction, a plurality of second reference memory cells extending in the first direction alternately with the first reference memory cells, and a combined cell having at least one pair of the first reference memory cell and the second reference memory cell that share a common gate, the common gate being enabled in both the first reference memory cell and the second reference memory cell in the at least one pair such that a current flows in both the first reference memory cell and the second reference memory cell in the at least one pair at a same time to generate a reference signal for processing the data in the main memory cell, the first and the second reference memory cells having different cell characteristics.

17. The non-volatile memory system of claim 16, further comprising:
a reference cell controller configured to select the first and the second reference memory cells in accordance with signals applied to the data cell array, thereby configuring the combined cell.

18. The non-volatile memory system of claim 17, further comprising:
a plurality of reference bit lines to each of which the first and the second reference memory cells are alternately connected in a line extending in a second direction perpendicular to the first direction.

19. The non-volatile memory system of claim 18, wherein the first and the second reference memory cells in the combined cell are connected to the same reference bit line, so that the combined cell includes a single pair of the first reference memory cell and the second reference memory cell.

20. The non-volatile memory system of claim 18, wherein the combined cell includes a plurality of the first reference memory cells that are connected to the different reference bit lines and a same number of the second reference memory cells, so that the combined cell includes a number of pairs of the first reference memory cell and the second reference memory cell.

* * * * *